United States Patent
Yu et al.

[11] Patent Number: 5,903,497
[45] Date of Patent: May 11, 1999

[54] INTEGRATED PROGRAM VERIFY PAGE BUFFER

[75] Inventors: Andy Teng-Feng Yu, Palo Alto; Vikram Kowshik, San Jose, both of Calif.

[73] Assignee: Programmable Microelectronics Corporation, San Jose, Calif.

[21] Appl. No.: 08/995,682

[22] Filed: Dec. 22, 1997

[51] Int. Cl.[6] .................................................. G11C 16/06
[52] U.S. Cl. ............................. 365/185.22; 365/185.23; 365/185.12
[58] Field of Search ......................... 365/185.22, 185.12, 365/185.23

[56] References Cited

U.S. PATENT DOCUMENTS

| | | | |
|---|---|---|---|
| 5,666,307 | 9/1997 | Chang | 365/185.03 |
| 5,687,116 | 11/1997 | Kowshik et al. | 365/185.03 |
| 5,687,118 | 11/1997 | Chang | 365/185.19 |
| 5,691,939 | 11/1997 | Chang et al. | 365/185.18 |
| 5,706,227 | 1/1998 | Chang et al. | 365/185.18 |
| 5,796,656 | 8/1998 | Kowshik et al. | 365/185.23 |
| 5,801,994 | 9/1998 | Chang et al. | 365/185.29 |

*Primary Examiner*—David Nelms
*Assistant Examiner*—Andrew Q. Tran
*Attorney, Agent, or Firm*—Flehr Hohbach Test Albritton & Herbert LLP; William L. Paradice, III

[57] ABSTRACT

A semiconductor memory includes a plurality of memory cells and a corresponding plurality of page buffers. When writing to a selected row of cells, input data is first latched into the page buffers. The cells in the selected row are then programmed according to the data latched within the page buffers. After programming, data stored in the cells is forwarded to the corresponding page buffers. If, for each cell, the data stored in the cell matches the data latched in its corresponding page buffer, the page buffer is reset. The selected row of cells are subsequently re-programmed, whereby only cells corresponding to those page buffers which have not been reset are re-programmed. In this manner, cells properly programmed during the first program operation are not re-programmed during program verify operations.

14 Claims, 3 Drawing Sheets

INTEGRATED PROGRAM VERIFY PAGE BUFFER

BACKGROUND

1. Field of Invention

This invention relates generally to semiconductor memories and specifically to a page buffer having automatic program verify and reset features.

2. Description of Related Art

Non-volatile memories such as, for instance, EEPROM and Flash EEPROM, include a plurality of memory cells contained within an array. Typically, the memory cells are floating gate MOS transistors having a source, a drain, a floating gate, and a control gate. Since such floating gate memory cells are programmed by inducing the accumulation of electrons on the floating gate and erased by discharging electrons from the floating gate, the threshold voltage ($V_T$) of a programmed cell is more positive than that of an erased cell. It is the difference between the program $V_T$ and the erase $V_T$ of a cell which determines the "binary state" of the cell. For instance, a programmed cell represents the binary value "1", and an erased cell represents the binary value binary "0". To read the binary state of a cell, a read voltage which lies between the program $V_T$ and the erase $V_T$ is applied to the control gate of the cell. Thus, if the cell is an NMOS device, the cell conducts a channel current if in an erased state and, conversely, if the cell is a PMOS device, the cell conducts a channel current if in a programmed state.

Typically, when writing data to a selected row of cells in the array, a first byte of input data is latched into page buffers of the memory and thereafter written to the first eight cells in the selected row (assuming, of course, that a byte is eight bits). The binary states of the cells are determined in a well known manner and compared with the first byte of input data. If there is a match, a second byte of input data is latched into the page buffers and thereafter written to the next eight cells of the selected row. If, on the other hand, the binary states of the first eight cells do not match the first byte of input data, thereby indicating that one or more of the first eight cells are not properly programmed, the cells are re-programmed. The binary states of these first eight cells are again compared to the first byte of data, and so on, until there is a match. This mechanism, commonly known as a program verify operation, ensures that the first eight cells in the selected row are properly programmed, that is, that they accurately represent the first byte of input data. The next byte of input data is then latched into the page buffers and thereafter written to the next eight cells in the selected row.

As mentioned above, the program $V_T$ of a floating gate memory cell is more positive than its erase $V_T$. Further, the threshold voltage of the cell, when properly programmed, should fall within a predetermined program $V_T$ range. Accordingly, when a program operation fails to sufficiently increase a cell's threshold voltage (in the positive direction) so as to fall within the program $V_T$ range, the cell remains in an erased state and, therefore, must be re-programmed to further increase its threshold voltage. However, a problem arises when only a portion of the cells corresponding to a particular data byte are not properly programmed. As noted above, when an inconsistency between a byte of input data and the respective binary states of the eight cells corresponding thereto is detected in a program verify operation, the entire byte of cells is re-programmed. Thus, while the respective threshold voltages of cells which were not properly programmed may now fall within the program $V_T$ range, the respective threshold voltages of cells which were properly programmed may now exceed the positive-most limit of the program $V_T$ range. As a result, a subsequent erase operation may not sufficiently discharge the floating gates of these "over-programmed" cells so as to return their threshold voltages to a level indicative of erased cells. In other words, these overprogrammed cells remain in a programmed state even after being erased, thereby resulting in the storage of erroneous data. Furthermore, over-charging the floating gate of a cell may degrade cell endurance.

SUMMARY

A page buffer is disclosed herein which overcomes problems in the prior art discussed above. In accordance with the present invention, a semiconductor memory includes a plurality of memory cells and a corresponding plurality of page buffers. When writing a row of data to a selected row of cells, the data is provided to the input pins of the memory and thereafter latched into corresponding page buffers. In response to the input data, the page buffers are driven to either a high state or a low state, where the high state indicates that a corresponding cell is to be programmed, and a low state indicates that the corresponding cell is to remain in an erased state. The selected row of cells are then programmed according to the data latched in the corresponding page buffers. In this manner, an entire row of data is written to the array in single program operation.

After the program operation, the respective binary states of the cells are forwarded to corresponding page buffers, thereby commencing a program verify operation in accordance with the present invention. If, for each page buffer, the ascertained binary state of its corresponding cell matches the binary state latched within the page buffer, the page buffer is reset to the low state. If, on the other hand, the ascertained binary state of the page buffer's corresponding cell does not match the binary state latched within the page buffer, the page buffer is not reset. The selected row of cells are then re-programmed according to the respective binary states of the corresponding page buffers, where only the cells corresponding to page buffers which remain in the high state are re-programmed. In this manner, cells which were properly programmed during the first program operation are not subsequently re-programmed, thereby eliminating over-programming of these cells and, therefore, increasing reliability of these cells.

Like components in the Figures are similarly labeled.

DETAILED DESCRIPTION

Principles of the present invention are described below with reference to a non-volatile semiconductor memory 10 for simplicity only. It is to be understood that embodiments of the present invention may be employed in memories of varying sizes (e.g., 64k, 128k, 256k, 512k, 1M, 2M, and so on), configurations (e.g., EPROM, EEPROM, Flash EEPROM), and bus widths (e.g., 8-bit, 16-bit, 32-bit, 64-bit, and so on). Accordingly, the present invention is not to be construed as limited to specific examples herein but rather includes within its scope all embodiments defined by the appended claims.

Figure 1:
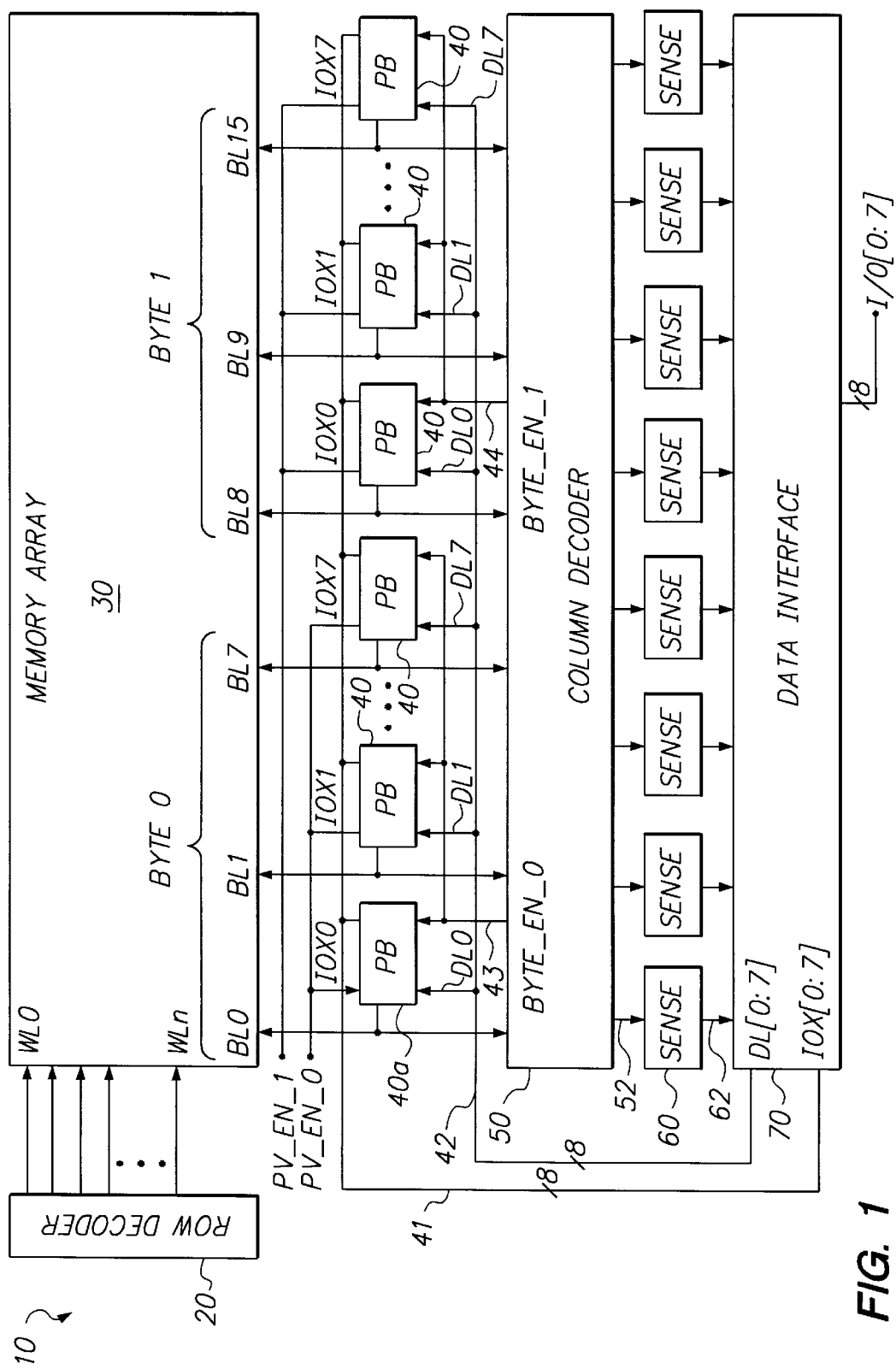
FIG. 1 is a block diagram of a non-volatile semiconductor memory employing a page buffer in accordance with the present invention.

Referring to FIG. 1, the memory 10 is shown to include a row decoder 20, a memory array 30, page buffers 40, a column decoder 50, sense circuits 60, and a data interface 70. Although not shown for simplicity, in actual embodiments the memory 10 includes additional circuitry such as, for instance, charge pumps, level shifters, input and output buffers, and so on. In preferred embodiments, the array 30 includes a plurality of PMOS memory cells. Examples of suitable PMOS memory cells and the advantages thereof are described in commonly owned U.S. Pat. Nos. 5,666,307 and 5,687,118, and in co-pending U.S. patent applications Ser. No. 08/568,835 entitled "Triple Poly PMOS Flash Memory Cell" and filed on Dec. 7, 1995, now U.S. Pat. No. 5,691,939, and Ser. No. 08/568,544 entitled "Double Poly Split Gate PMOS Flash Memory Cell" and filed Dec. 7, 1995, now U.S. Pat. No. 5,706,227, all incorporated herein by reference.

Figure 2:
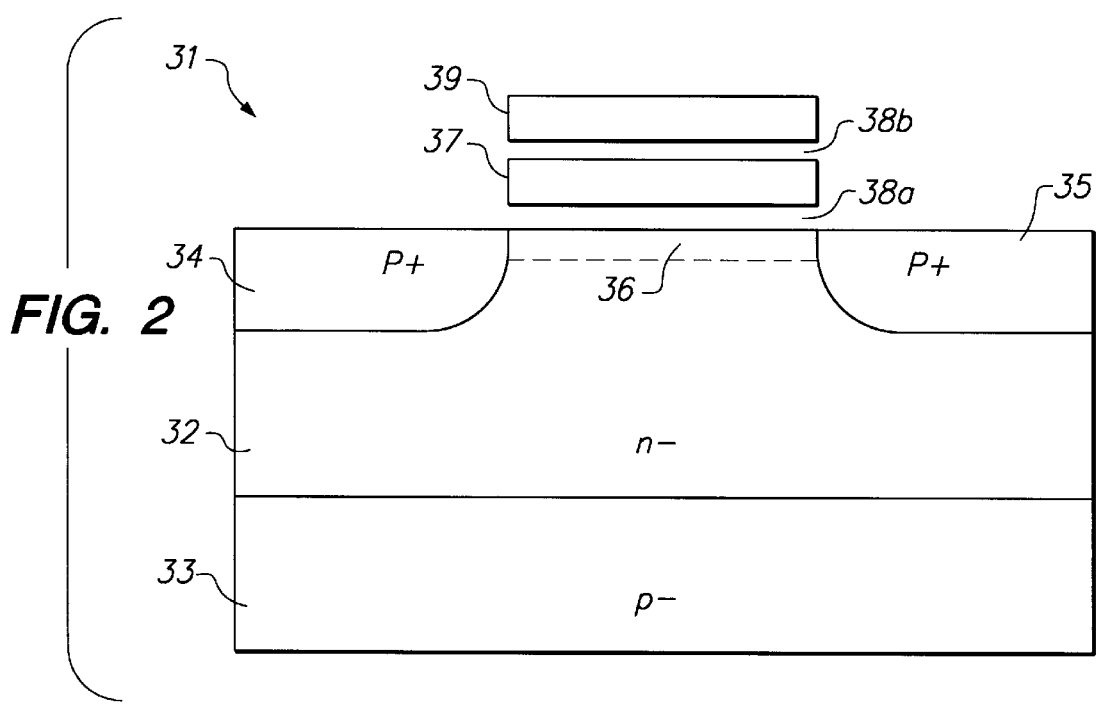
FIG. 2 is a cross-sectional view of a PMOS floating gate memory cell employed in a preferred embodiment of the memory of FIG. 1.

For convenience, it is assumed that the array 30 includes a plurality of PMOS memory cells of the type disclosed in U.S. Pat. No. 5,687,118 and shown, for example, in FIG. 2. It should be noted, however, that embodiments of the present invention are not limited to PMOS memory cells but, rather, are also suitable for use with-NMOS memory cells. As shown in FIG. 2, the PMOS floating gate transistor 31 is formed in an n– well region 32 of a p– substrate 33. A p+ source 34 and a p+ drain 35 are formed in the n– well region 32. A channel region 36 extends within the n– well 32 between the p+ source 34 and the p+ drain 35. A polysilicon floating gate 37 is insulated from the n– well region 32 by a thin oxide layer 38a. A control gate 39 is insulated from the floating gate 37 by an insulating layer 38b. In its intrinsic or erased state, the cell 31 has a negative threshold voltage $V_T$.

The cell 31 may be programmed by a variety of mechanisms, including channel hot electron (CHE) injection, Fowler-Nordheim (FN) Tunneling, band-to-band tunneling (BTBT) induced electron injection, and various combinations thereof. When the cell 31 is programmed, its threshold voltage $V_T$ is positive. The cell 31 is read by applying approximately 3 volts to the n– well region 32 and source 34, holding the drain 35 at a small positive voltage, and grounding the control gate 39. Under these bias conditions, the cell 31 conducts a channel current if in a programmed state; if in an erased state, the cell 31 does not conduct a channel current. The cell 31 is erased by FN tunneling.

The array 30 may employ the cells 31 in a variety of suitable cell configurations, such as those described in the commonly owned U.S. patent applications Ser. No. 08/911,968 entitled "Nonvolatile Memory Array Architecture", and filed Aug. 15, 1997, now U.S. Pat. No. 5,801,994, Ser. No. 08/948,531 entitled "PMOS Memory Array Having OR Gate Architecture" and filed Oct. 9, 1997, now pending, and Ser. No. 08/947,850 entitled "Nonvolatile PMOS Two Transistor Memory Cell and Array" and filed Oct. 9, 1997, now pending, all incorporated herein by reference. However, for simplicity of discussion herein, it is assumed that the array 30 employs the floating gate transistors 31 as one-transistor (1T) memory cells, i.e., without select transistors, as described, for instance, in the above-referenced U.S. patent application Ser. No. 08/911,968.

The array 30 is shown in FIG. 1 to include sixteen bit lines BL, each of which is coupled to the cells 31 (not shown in FIG. 1) in a common column. The bit lines BL are divided into groups of eight, where the first eight bit lines BL0–BL7 correspond to a first data byte BYTE0 and the second eight bit lines BL8–BL15 correspond to a second data byte BYTE1. Each bit line BL is connected to an associated page buffer 40 and to an input terminal of the column decoder 50. The page buffers 40 are connected to the data interface 70 via eight-bit buses 41 and 42. Further, the page buffers 40 associated with the first data byte BYTE0 are connected to the column decoder 50 via line 43 upon which a first byte enable signal BYTE_EN_0 is asserted, and the page buffers 40 associated with the second data byte BYTE1are connected to the column decoder 50 via line 44 upon which a second byte enable signal BYTE_EN_1 is asserted. The column decoder 50 includes eight output terminals, each of which is connected to one of the sense circuits 60 via lines 52. The sense circuits 60 are connected to the data interface 70 via lines 62. The data interface 70 is connected to eight data input/output (I/O) pins of the memory 10.

It is again noted that the configuration of the memory 10, as shown in FIG. 1 for example, is merely illustrative of present embodiments. In actual embodiments, the array 30 typically includes a greater number of columns, i.e., bit lines BL, such that each row of the array is more than two bytes wide. Further, byte size is not limited to eight bits. In preferred embodiments, the row decoder 20 and the sense circuit 50 are of the types disclosed in the commonly owned and co-pending U.S. patent applications Ser. No. 08/803,806 entitled "Row Decoder Circuit for PMOS Non-volatile Memory Cell which uses Electron Tunneling for Programming and Erasing" and filed on Feb. 22, 1997, now U.S. Pat. No. 5,796,656, and Ser. No. 08/987,796 entitled "SENSE AMPLIFIER" and filed on Dec. 10, 1997, respectively, both incorporated herein by reference.

Figure 3:
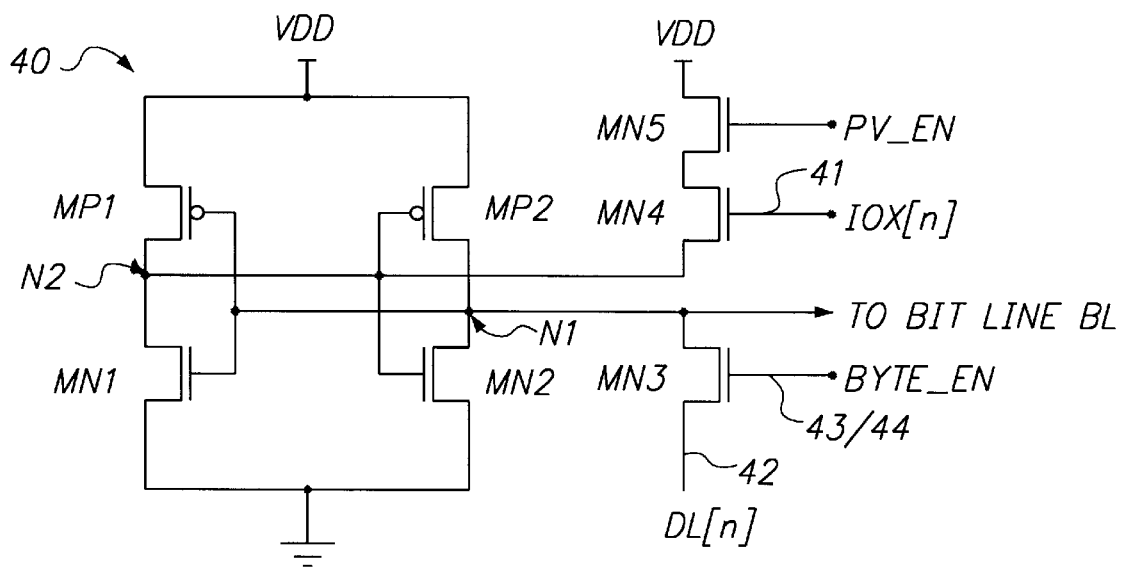
FIG. 3 is a schematic diagram of the page buffer shown in FIG. 1.

Referring now to FIG. 3, the page buffer 40 includes a cross-coupled latch formed by two PMOS transistors MP1 and MP2 and two NMOS transistors MN1 and MN2. The common source of transistors MN1 and MN2 is coupled to ground potential. The common source of transistors MP1 and MP2 is coupled to a supply voltage $V_{DD}$. The common drain of transistors MN2 and MP2 is coupled to the gates of transistors MN1 and MP1 and to an associated bit line BL of the array 30 at node N1. A pass transistor MN3 is connected between the bit line BL, i.e., node N1, and bus 42. The gate of the pass transistor MN3 is coupled to receive a byte enable signal BYTE_EN from the column decoder 50. The common drain of the transistors MN1 and MP1 is coupled to the gates of the transistors MN2 and MP2 at node N2. Pass transistors MN4 and MN5 are connected between node N2 and $V_{DD}$. The gate of pass transistor MN4 is coupled to bus 41. The gate of pass transistor MN5 is coupled to receive a program verify enable signal PV_EN.

Binary data is stored in the page buffer 40 by manipulating the potential levels within its cross-coupled latch. To enable data storage in the page buffer 40, the signal BYTE_EN is forced to a logic high state so as to turn on transistor MN3. As a result, node N1 of the page buffer 40 is forced to the logic state of a data signal received from the data interface 70 via bus 42. Thus, for instance, if the data signal received via bus 42 is a logic high signal, i.e., representing a binary "1", node N1 is forced to a logic high level. In this case, transistor MN1 turns on and pulls node N2 to a logic low level, i.e., ground potential, while transistor MP1 turns off and isolates node N2 from $V_{DD}$. Conversely, if the data signal received via bus 42 is a logic low signal, i.e., representing a binary "0", node N1 is forced to a logic low level. Here, transistor MP1 turns on pulls node N2 high to $V_{DD}$, while transistor MN1 turns off and isolates node N2 from ground potential.

Operation of the page buffers 40 within the context of the memory 10 is described below with reference to FIGS. 1, 2, and 3. Generally, data to be stored in a row of the cells 31 of the array 30 is first latched into the page buffers 40 one byte at a time. Once a row (sometimes called a page) of data has been latched into the page buffers 40, the cells 31 in the selected row of the array 30 are then programmed according to the binary data latched in the page buffers 40. In this manner, an entire row of data is written in a single program operation, thereby requiring less than approximately 5 ms to program a row of cells 31. Integrity of the page of data programmed into the selected row of the array 30 is verified in a subsequent program verify operation, during which page buffers 40 that correspond to properly programmed cells 31 are reset. Only the cells 31 corresponding to page buffers which remain in a "set" state are subsequently re-programmed. Thus, since the cells which were properly programmed during the first program operation are not subsequently re-programmed, cell over-programming is eliminated.

Specifically, when writing a page of data to a selected row of the array 30, an externally generated row address is provided to the row decoder 20 which, in response thereto, selects a row of cells 31 in the array 30 for a program operation. This may be accomplished by driving the word line WL of the selected row to a predetermined program voltage. In some embodiments, for instance, the program voltage is a ramped voltage of the type described in U.S. Pat. No. 5,687,116. The first byte of input data is provided on data pins I/0[0:7] of the memory 10. The eight page buffers corresponding to the first eight cells 31 of the selected row, i.e., BYTE0, are enabled by driving the signal BYTE_EN_0 on line 43 high. This first input data byte is routed via the data interface 70 to bus 42. The eight bits on bus 42, hereinafter referred to as DL[0:7], are provided to respective ones of the eight enabled page buffers 40 and thereafter latched therein, as described above with respect to FIG. 3. Thus, if the data bit DL[0] provided to page buffer 40a is a "1", node N1 of page buffer 40a is forced high to $V_{DD}$. Conversely, if the data bit DL[0] is a "0"I, node N1 of page buffer 40a is forced low to ground potential.

A second byte of data is then provided on the data pins I/0[0:7]. The first eight page buffers 40 are disabled by asserting the signal BYTE_EN_0 low, and the second eight page buffers 40, which correspond to the second eight cells 31 of the selected row, i.e., BYTE1, are enabled by asserting the signal BYTE_EN-1 high. The second input data byte is routed to and latched in the second eight page buffers 40 as described above. In those embodiments in which the rows of the array 30 include more than sixteen memory cells, this process is repeated until an entire page of data is latched into the page buffers 40.

Then, the entire row of selected cells is programmed in accordance with the page of data latched in the page buffers 40. For each page buffer 40 whose node N1 is high (i.e., at $V_{DD}$), the bit line BL associated therewith is driven to an enabling potential that allows the corresponding cell 31 in the selected row to be programmed. Conversely, for each page buffer 40 whose node N1 is low (i.e., at ground potential), the bit line BL associated therewith is driven to a disabling potential that precludes programming of the corresponding cell 31 in the selected row. Suitable potential levels which allow and preclude the programming of a PMOS memory cell are disclosed, for instance, in U.S. Pat. Nos. 5,687,116 and 5,687,118 and in the above-referenced U.S. patent application Ser. No. 08/911,968.

Thus, where it is desired to write a "1" to the first cell 31 of a selected row of the array 30, a logic high data bit signal is provided to the first data pin I/O[0] and thereafter routed to and latched in the first page buffer 40a. Thus, node N1 of page buffer 40a is pulled high to $V_{DD}$ and, in response thereto, the first bit line BL0 is driven to the enabling potential so as to allow the first cell 31 in the selected row to be programmed. Where, on the other hand, it is desired to write a binary "0" to the first cell 31, a logic low data bit signal is provided to data pin I/O[0] and thereafter routed to and latched within the page buffer 40a. Thus, node N1 of page buffer 40a is pulled low to ground potential and, in response thereto, bit line BL0 is driven to the disabling potential so as to preclude programming of the first cell 31. As mentioned above, the cell 31 has a positive $V_T$ when in a programmed state, thereby representing a binary "1", and a negative $V_T$ when in an erased state, thereby representing a binary "0".

After the selected row of cells 31 is programmed according to the data page latched in the page buffers 40, a program verify operation is performed to ensure that the cells 31 are properly programmed. A program verify enable signal PV_EN_0 is asserted logic high so as to enable program verification of the first data byte. The binary states of the first eight cells 31 in the selected row are read in a suitable manner. As explained above, the cells 31 conduct a channel current during read operations if programmed. Thus, in preferred embodiments, the bit lines BL corresponding to programmed cells 31 are charged, via cell channel current, to a first positive voltage. Since cells 31 in an erased state do not conduct a channel current, the bit lines BL corresponding thereto are at a second positive voltage, wherein the second positive voltage is less than the first positive voltage. The voltages of the first eight bit lines BL0–BL7 are provided to corresponding sense circuits 60 via the column decoder 50. Each sense circuit 60 compares its received bit line voltage to a reference voltage and, in response thereto, provides an output signal on line 62 indicative of the binary state of the corresponding cell 31. The resulting eight output signals are routed via the data interface 70 to bus 41 as a byte IOX[0:7].

Thus, referring also to FIG. 3, the high PV_EN_0 signal enables the first eight page buffers 40 by turning on their respective pass transistors MN5. The eight bits IOX[0:7] on bus 41 are provided to respective ones of the first eight page buffers 40 via the gate of pass transistor MN4. In this manner, the cross-coupled latch within each of the first eight page buffers 40 is reset to a low state if its corresponding cell 31 is properly programmed. Thus, for instance, if the bit IOX[0] received at the gate of pass transistor MN4 of the first page buffer 40a is logic high, thereby indicating that the corresponding cell 31 is in a programmed state, pass transistor MN4 turns on and pulls node N2 of the first page buffer 40a high to $V_{DD}$. Node N1 of the first page buffer 40a is thereby forced low to ground potential, as explained above. In this manner, the cross-coupled latch within the first page buffer 40a is reset to the low state.

If, on the other hand, the bit IOX[0] received at the gate of pass transistor MN4 of the first page buffer 40a is logic low, thereby indicating the corresponding cell 31 is in an erased state, transistor MN4 remains non-conductive and isolates node N2 of the first page buffer 40a from $V_{DD}$. As a result, the binary state of the cross-coupled latch within the first page buffer 40a remains undisturbed. In this case, if node N1 of the first page buffer 40a is low ("0"), then the data latched within the cross-coupled latch thereof matches the binary state of the corresponding cell 31 ("0") and, therefore, re-programming of that cell 31 is not necessary. However, if node N1 of the first page buffer 40a is high ("1"), then the data latched within the cross-coupled latch thereof is inconsistent with the binary state of the corresponding cell 31 ("0") and, therefore, re-programming of that cell 31 is necessary. This process is repeated, one byte at a time, until the entire page of data stored in the selected row of cells 31 is verified.

A program operation is again performed as described above, whereby only cells 31 corresponding to those page buffers 40 which remain in the high state ("1") are re-programmed. In this manner, cells 31 that are properly re-programmed during the first program operation are not subsequently re-programmed. As a result, cell over-programming resulting from program verify operations is eliminated. Program verification continues until all of the cells 31 in the selected row are properly programmed.

Figure 4:
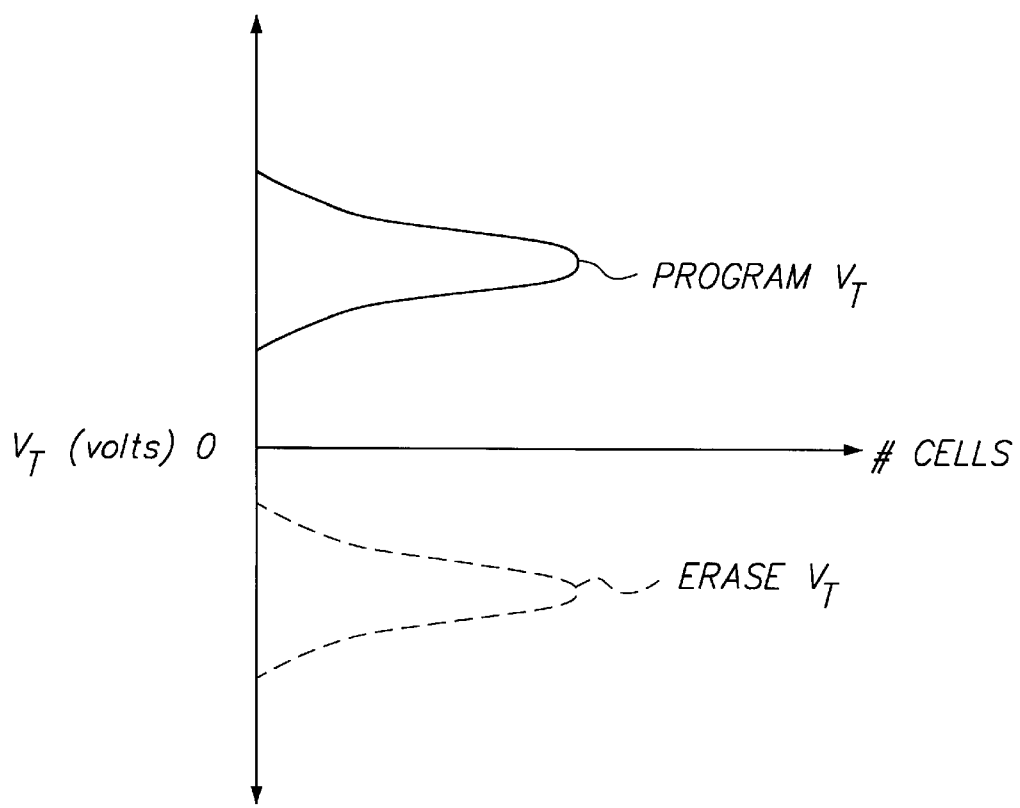
FIG. 4 is a graph illustrating the programming threshold voltage ($V_T$) range of the PMOS memory cell of FIG. 2.

Referring now to FIG. 4, when the cell 31 is in a programmed state, its threshold voltage $V_T$ is positive and should fall within a program $V_T$ range, as indicated by the solid line. When the cell 31 is in an erased state, its $V_T$ is negative and should fall within an erase $V_T$ range, as indicated by the dashed line. Since the $V_T$ of a memory cell becomes more positive as a result of programming, re-programming a cell which is already properly programmed, as practiced by prior art program verification techniques, may push the cell's $V_T$ beyond the upper limit of the program $V_T$ range. If the resulting $V_T$ of the cell becomes too positive, i.e., the cell is over-programmed, a subsequent erase operation may not sufficiently discharge the cell so as to bring its $V_T$ within the erase $V_T$ range. As a result, the cell remains in a programmed state even after being erased, thereby resulting in the storage of invalid data.

In contrast, program verification in accordance with the present invention is performed in a bit specific manner. As described above, when the threshold voltage $V_T$ of a cell 31 desired to be programmed becomes sufficiently positive so as to fall within the program $V_T$ range illustrated, for example, in FIG. 4, thereby indicating that the cell 31 is properly programmed, the cell 31 is thereafter isolated from subsequent re-program operations. Thus, as detailed above, present embodiments eliminate cell over-programming resulting from program verify operations. Moreover, since increasing the $V_T$ of a memory cell beyond a nominal value degrades cell endurance, present embodiments advantageously minimize degradation of cell endurance resulting from over-programming.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A semiconductor memory comprising:
   one or more rows each comprising a plurality of memory cells,
   a plurality of page buffers, coupled to said plurality of memory cells, each of which comprises:
      a data input terminal coupled to receive data desired to be stored in a corresponding one of said memory cells during a program operation of said semiconductor memory;
      a cross-coupled latch having a first node selectively coupled to said input terminal and having a second node, wherein said cross-coupled latch is driven to a binary state consistent with the binary state of said data; and
      a first pass transistor coupled between said second node and a voltage supply and having a gate coupled to receive a signal indicative of the binary state of said corresponding memory cell subsequent to said program operation.

2. The memory of claim 1, wherein during said program operation a plurality of said data is first latched into said page buffers, whereby said plurality of said memory cells are then simultaneously programmed according to said binary states of said cross-coupled latches within respective ones of said plurality of page buffers.

3. The memory of claim 1, wherein after said program operation said cross-coupled latch is reset if the binary state of said corresponding memory cell matches the binary state of said cross-coupled latch.

4. The memory of claim 1, further comprising a second pass transistor coupled between said first pass transistor and said voltage supply and having a gate coupled to receive a program verify enable signal.

5. The memory of claim 1, further comprising a third pass transistor coupled between said first node and said data input terminal and having a gate coupled to receive an address identifying said corresponding memory cell.

6. The memory of claim 1, wherein said memory cells comprise PMOS floating gate transistors.

7. The memory of claim 1, wherein said memory cells comprise NMOS floating gate transistors.

8. The memory of claim 1, wherein said crosscoupled latch comprises:
   first and second PMOS transistors each having a source coupled to said voltage supply, a gate, and a drain; and
   first and second NMOS transistors each having a source coupled to ground potential, a gate, and a drain,
   wherein said gates of said first PMOS and said first NMOS transistors are coupled to said first node and said gates of said second PMOS and second NMOS transistors are coupled to said second node.

9. The memory of claim 1, wherein each of said plurality of page buffers corresponds to one of said plurality of memory cells.

10. A method for verifying a program operation in which a page of data is programmed into a selected row of memory cells in an associated memory array, said method comprising the steps of:
   latching said page of data into a plurality of page buffers, wherein each page buffer corresponds to one of said memory cells in said selected row and is in either a first or a second binary state as determined by said data;
   programming said selected row according to said latched data;
   determining the binary states of each of said memory cells in said selected row;
   comparing the binary states of said memory cells to the respective binary states of corresponding page buffers;
   resetting each of said page buffers to said first binary state in response to said comparing step; and
   re-programming each of said memory cells whose corresponding page buffer remains in said second binary state.

11. The method of claim 10, wherein said first binary state indicates a corresponding one of said memory cells is in an erased state and said second binary state indicates said corresponding one of said memory cells is in a programmed state.

12. The method of claim 10, wherein said memory cells comprise PMOS floating gate transistors.

13. The method of claim 10, wherein said memory cells comprise NMOS floating gate transistors.

14. The method of claim 10, wherein each of said page buffers includes a cross-coupled latch storing said binary states.

* * * * *